(12) United States Patent
Haratani et al.

(10) Patent No.: US 7,956,609 B2
(45) Date of Patent: Jun. 7, 2011

(54) MAGNETIC SENSOR INCLUDING A SPIN-VALVE GMR DEVICE

(75) Inventors: Susumu Haratani, Tokyo (JP); Hitoshi Yamaguchi, Tokyo (JP); Naoki Ohta, Tokyo (JP)

(73) Assignee: TDK Corporation, Tokyo (JP)

( * ) Notice: Subject to any disclaimer, the term of this patent is extended or adjusted under 35 U.S.C. 154(b) by 500 days.

(21) Appl. No.: 12/053,219

(22) Filed: Mar. 21, 2008

(65) Prior Publication Data

US 2008/0238420 A1   Oct. 2, 2008

(30) Foreign Application Priority Data

Mar. 30, 2007   (JP) ................ P2007-092486

(51) Int. Cl.
  *G01R 33/02*  (2006.01)
  *G01B 7/30*   (2006.01)
  *G01B 7/14*   (2006.01)

(52) U.S. Cl. ............... 324/252; 324/207.25; 324/207.24

(58) Field of Classification Search ................... 324/252
See application file for complete search history.

(56) References Cited

U.S. PATENT DOCUMENTS

| | | | |
|---|---|---|---|
| 6,028,730 A | 2/2000 | Ishihara | |
| 6,556,007 B1 | 4/2003 | Abe et al. | |
| 6,717,400 B2 * | 4/2004 | Ito et al. | 324/207.13 |
| 7,138,798 B1 | 11/2006 | Abe et al. | |
| 7,463,016 B2 * | 12/2008 | Shoji | 324/117 R |
| 2002/0135935 A1 * | 9/2002 | Covington | 360/126 |
| 2006/0007607 A1 | 1/2006 | Abe et al. | |
| 2006/0119356 A1 * | 6/2006 | Rabe et al. | 324/252 |
| 2007/0164734 A1 * | 7/2007 | Shimizu et al. | 324/207.25 |
| 2008/0116885 A1 * | 5/2008 | Van Zon et al. | 324/207.21 |
| 2008/0284420 A1 * | 11/2008 | Takeya et al. | 324/207.21 |
| 2010/0156405 A1 * | 6/2010 | Furukawa et al. | 324/252 |

FOREIGN PATENT DOCUMENTS

| | | |
|---|---|---|
| JP | A-10-208216 | 8/1998 |
| JP | A-2002-310659 | 10/2002 |
| JP | A-2004-325344 | 11/2004 |
| JP | A-2006-29899 | 2/2006 |

* cited by examiner

*Primary Examiner* — Jay M Patidar
(74) *Attorney, Agent, or Firm* — Oliff & Berridge, PLC

(57) ABSTRACT

The magnetic sensor comprises a spin-valve GMR including a free layer having an elongated form as seen in a laminating direction and a permanent magnet layer having an elongated form as seen in the laminating direction. The permanent magnet layer is arranged in parallel with the free layer.

8 Claims, 11 Drawing Sheets

MAGNETIC SENSOR INCLUDING A SPIN-VALVE GMR DEVICE

BACKGROUND OF THE INVENTION

1. Field of the Invention

The present invention relates to a magnetic sensor utilizing a magnetoresistive effect.

2. Related Background Art

Various magnetic sensors utilizing magnetoresistive effects have conventionally been known as disclosed in Patent Document (Japanese Patent Application Laid-Open No. 2002-310659), for example.

SUMMARY OF THE INVENTION

The conventional magnetic sensors, MR vs eternal magnetic field curves exhibited by the magnetoresistive devices incur a large hysteresis.

In view of the problem mentioned above, it is an object of the present invention to provide a magnetic sensor in which the hysteresis in its MR vs. eternal magnetic field curve is suppressed.

The magnetic sensor in accordance with the present invention comprises a spin-valve GMR device including a free layer having an elongated form as seen in a laminating direction and a permanent magnet layer having an elongated form as seen in the laminating direction, while the permanent magnet layer and the free layer have respective longitudinal directions arranged parallel to each other and are separated from each other in a direction intersecting the longitudinal direction of the free layer.

In the present invention, the permanent magnet layer efficiently applies a bias magnetic field to the free layer, whereby the hysteretic property of the MR vs. external magnetic field curve is suppressed.

Preferably, the permanent magnet layer is provided in a pair, while the pair of permanent magnet layers are arranged such as to hold the free layer therebetween in a direction intersecting the longitudinal direction of the free layer and intersecting the laminating direction of the free layer.

In this case, the two permanent magnet layers can efficiently apply a bias magnetic field to the free layer. Also, the two permanent magnet layers can be formed at the same time.

Preferably, the permanent magnet layer is arranged over the free layer.

In this case, a single permanent magnet layer can apply a sufficient bias magnetic field to the whole free layer.

Preferably, the bias magnetic field exerted on the free layer by the permanent magnet layer has a direction substantially parallel to the longitudinal direction of the free layer. Preferably, the longitudinal direction of the free layer is a direction of an axis of easy magnetization.

This can effectively apply the bias magnetic field to the free layer of the spin-valve GM device.

The present invention provides a magnetic sensor in which the hysteresis in the MR vs. external magnetic field curve is suppressed.

DESCRIPTION OF THE PREFERRED EMBODIMENTS

Figure 1:
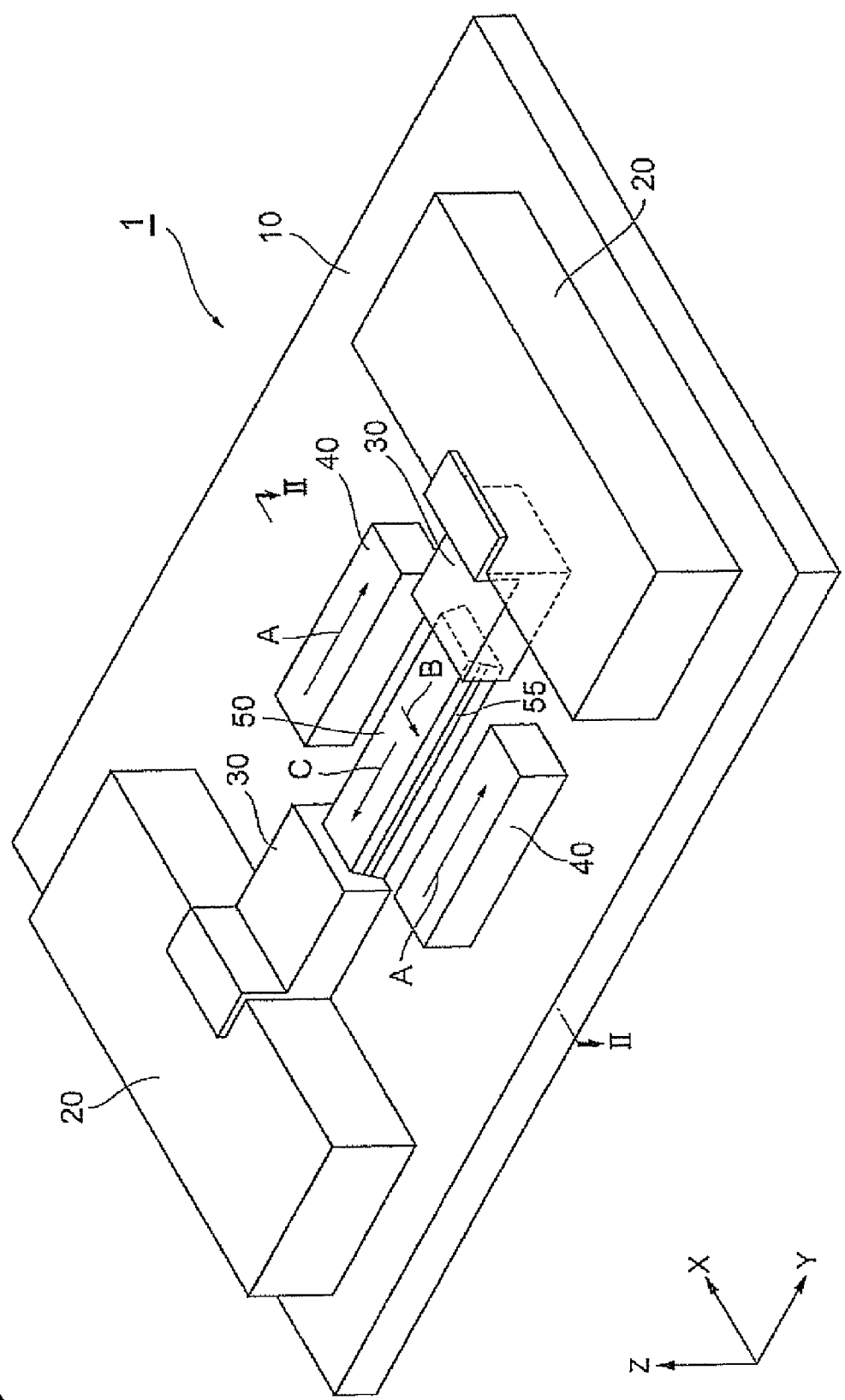
FIG. 1 is a schematic perspective view of the magnetic sensor in accordance with the first embodiment.

In the following, preferred embodiments of the present invention will be explained in detail while referring to the drawings when necessary. Positional relationships such as those in terms of upper, lower, left and right are based on those shown in the drawings unless otherwise specified. Ratios of dimensions in the drawings are not limited to those depicted.

First Embodiment

Figure 2:
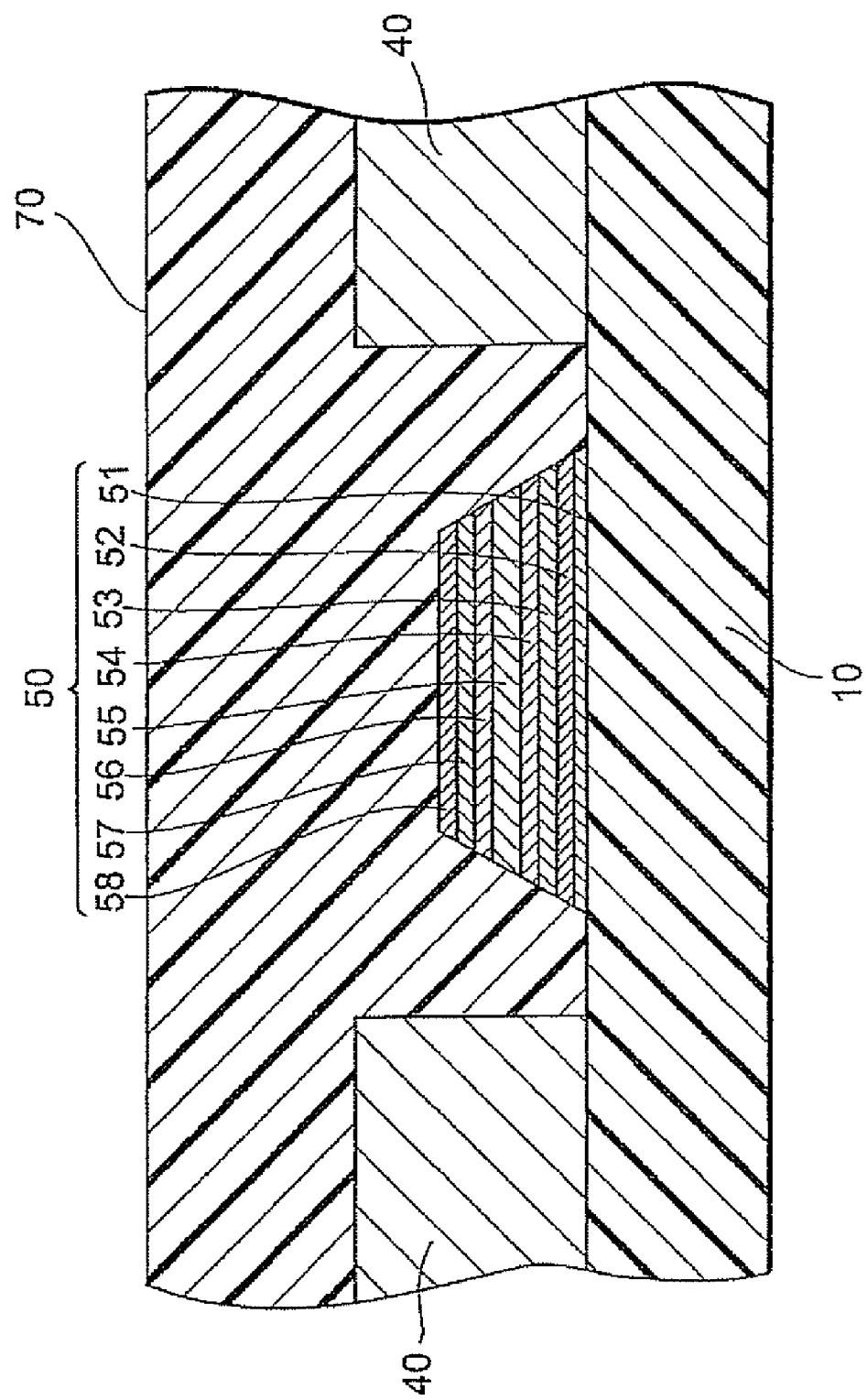
FIG. 2 is a sectional view taken along the line II-II of FIG. 1.

FIG. 1 is a schematic perspective view of the magnetic sensor 1 in accordance with the first embodiment FIG. 2 is a sectional view taken along the line II-II of FIG. 1.

The magnetic sensor 1 is a magnetic sensor for detecting the strength of external magnetic fields in ±X directions. The magnetic sensor 1 mainly comprises a substrate 10, electrode pads 20, leads 30, a GMR stripe (magnetoresistive device) 50, and permanent magnet layers 40.

The substrate 10 is planar, for which an alumina substrate, a substrate in which an alumina insulating layer is formed on AlTiC, a substrate in which an insulating film is formed on an Si substrate, or a thermally-oxidized Si substrate can be used for example.

A pair of electrode pads 20 are provided on the substrate 10 while being separated from each other. Though not restricted in particular, examples of their materials include metals such as Au.

The GMR stripe (spin-valve GM device) 50 is laminated on the substrate 10 and exhibits an elongated form when seen in the laminating direction. The GMR stripe 50 is arranged between the electrode pads 20, 20, while the longitudinal direction of the GMR stripe 50 is parallel to a direction connecting the electrode pads 20, 20 to each other. Though not restricted in particular, the aspect ratio of the GMR stripe 50 as seen in the laminating direction, i.e., the ratio of Y-direction length/X-direction length in FIG. 1, is preferably 10 or greater, for example, from the viewpoint of improving the MR ratio.

The thickness of the GMR stripe 50 is typically on the order of 200 to 700 nm. When seen in the laminating direction the GMR stripe 50 may have a longitudinal (Y-direction) length of 5 to 200 nm, for example, and a widthwise (X-detection) length of 2 to 30 nm, for example.

As shown in FIG. 2, the GM stripe 50 comprises a foundation layer 51, an antiferromagnetic layer 52, a pinned layer 53, a nonmagnetic conductor layer 54, a free layer 55, a nonmagnetic conductor layer 56, a pinned layer 57, and an antiferromagnetic layer 58 successively from the substrate 10 side.

The foundation layer 51 is formed when necessary. Examples of materials for this layer include Cr, Ta, and NiCr.

Examples of materials employable for the antiferromagnetic layers 52, 58 include IrMn, PtMn, FeMn, NiMn, PtPdMn, and NiO.

Examples of materials employable for the pinned layers 53, 57 and free layer 55 include ferromagnetic materials such as Co, CoFe, NiFe, NiFeCo, CoPt, and CoFeB and their multilayer bodies.

The pinned layers 53, 57 are in contact with the antiferromagnetic layers 52, 58, respectively, and have their directions of magnetization pinned by exchange coupling with the antiferromagnetic layers 52, 58. The directions of magnetization of antiferromagnetic layers 52, 58 are preferably set to X direction respectively as shown in arrow B of FIG. 1.

Examples of materials employable for the nonmagnetic conductor layers 54, 56 include metal materials such as Cu.

The layers may have any thickness without being restricted in particular as long as an MR effect can be exhibited thereby.

Each permanent magnet layer 40 is a film having an elongated form as seen in the laminating direction. Preferably, the Y-direction length of the permanent magnet layer 40 is at least 80% that of the GMR stripe 50.

In this embodiment the longitudinal directions of the permanent magnet layers 40, 40 and the longitudinal direction of the GMR stripe 50 are arranged parallel to each other, while the permanent magnet layers 40, 40 and the GMR stripe 50 are separated from each other in a direction intersecting the longitudinal direction of the GMR stripe 50. The pair of permanent magnet layers 40, 40 are arranged such as to hold the GMR stripe 50 therebetween in a direction which intersects the longitudinal and laminating directions of the GMR stripe 50, i.e., in the X direction.

Examples of materials employable for the permanent magnet layers 40 include hard magnetic bodies having a high coercivity such as CoCrPt, CoPt and CoTa.

A magnetization in the direction of arrow A in FIG. 1, i.e., in the direction parallel to the longitudinal directions of the permanent magnet layers 40 and free layer 55, is applied to the permanent magnet layers 40, 40. As a consequence, a magnetic field in a direction opposite from that of the magnetization of the permanent magnet layers 40, 40, i.e., in the direction of arrow C in FIG. 1, acts on the free layer 55 of the GMR stripe 50. Namely, a bias magnetic field acts substantially parallel to the longitudinal direction of the free layer 55. Typically, the longitudinal direction of the free layer 55 becomes an axis of easy magnetization thereof. The magnitude of magnetization of the permanent magnet layers 40 is set such that a magnetic field which is not lower than the coercivity of the fee layer 55 of the GMR stripe 50 acts on the free layer 55.

The leads 30 are in contact with both end parts of the GMR stripe 50, respectively, and their corresponding electrode pads 20. Examples of materials for the leads 30 include metal materials such as Au.

Further, as shown in FIG. 2, a nonmagnetic insulating layer 70 made of alumina, silica, or the like is formed between the GMR stripe 50 and permanent magnet layers 40, on the GMR stripe 50, and on the permanent magnet layers 40.

An example of methods for making such a magnetic sensor 1 comprises the steps of forming a GMR film on the substrate 10 by a known method; then forming the GMR stripe 50 by photolithography or the like; thereafter forming the permanent-magnet layers 40 and leads 30 by photolithography; and forming the nonmagnetic insulating layer 70.

In such a magnetic sensor 1, the permanent magnet layers 40 apply the bias magnetic field in the direction of arrow C in FIG. 1 to the free layer 55 of the GMR stripe 50, whereby the free layer 55 is likely to attain a single magnetic domain. Therefore, the resulting MR vs. external magnetic field curve exhibits a high linearity in a middle part (the part ranging from 25% to 75% within the width of change in MR which will be explained later in detail) thereof and suppresses the hysteresis therein. Further, the magnetic isotropy with respect to the bias magnetic field applying direction becomes greater, thereby lowering Hys which will be explained later.

Specifically, the longitudinal directions of the permanent magnet layers 40 and the longitudinal direction of the free layer 55 are arranged parallel to each other, while the permanent magnet layers 40 and free layer 55 are separated from each other in a direction intersecting the longitudinal direction of the free layer 55. Therefore, as compared with the case where the permanent magnet layers 40 are arranged on both sides in the longitudinal direction (Y direction) of the GMR stripe 50, the free layer 55 as a whole can be located closer to the permanent magnet layers 40, which makes it easier to apply a sufficient magnetic field to the GMR stripe 50.

Further, since the free layer 55 is held between a pair of permanent magnet layers 40, 40, the magnetic field can efficiently be applied to the free layer 55 in is embodiment. The permanent magnet layers 40, 40 are easy to manufacture, since they have the same height and can be formed simultaneously.

Second Embodiment

The magnetic sensor 1 in accordance with the second embodiment of the present invention will now be explained with reference to FIGS. 3 and 4. The magnetic sensor 1 in accordance with the second embodiment differs from that of the first embodiment in that it has only one permanent magnet layer 40 and that the permanent magnet layer 40 is arranged over the GMR stripe 50. Specifically, as shown in FIG. 4, the permanent magnet layer 40 is arranged over the GMR stripe 50 with the nonmagnetic insulating layer 70 interposed therebetween.

The second embodiment yields effects similar to those of the first embodiment Since the permanent magnet layer 40 is located over the free layer 55, the permanent magnet layer 40 and the free layer 55 of the GMR stripe 50 as a whole can easily be brought closer to each other, whereby even the single permanent magnet layer 40 can apply a sufficient bias magnetic field (in the direction of arrow C) to the free layer 55 of the GMR stripe 50.

The present invention can be modified in various ways without being restricted to the above-mentioned embodiments. For example, it will be sufficient if the permanent magnet layer 40 is positioned such that the longitudinal direction of the permanent magnet layer 40 and the longitudinal direction of the free layer 55 are arranged parallel to each other while the permanent magnet layer 40 and the free layer 55 are separated from each other in a direction intersecting the longitudinal direction of the free layer 55. For example, the permanent magnet layer 40 may be arranged at positions rotated by any angle about the Y axis from those shown in FIGS. 1 and 3. The longitudinal direction of the permanent magnet layer 40 and the longitudinal direction of the free layer 55 are not required to be completely but substantially parallel to each other.

Though the above-mentioned embodiments employ a so-called dual spin-valve structure in which two spin valves each comprising an antiferromagnetic layer, a pinned layer, a nonmagnetic conductor layer, and a free layer are stacked as the GMR stripe 50, a structure equipped with only one spin valve will suffice.

Though the above-mentioned embodiments have a so-called CIP structure in which a current flows through the GMR stripe 50 longitudinally, a CPP structure in which the current flows trough the GMR stripe 50 in the laminating direction thereof will also suffice.

Though the above-mentioned embodiments employ the GMR stripe 50 using the nonmagnetic conductor layer 54, a TMR stripe using a nonmagnetic insulating layer such as MgO may be employed in place of the nonmagnetic conductor layer 54. Instead of the spin valve, so-called AMR stripes may be used as well.

Figure 5:
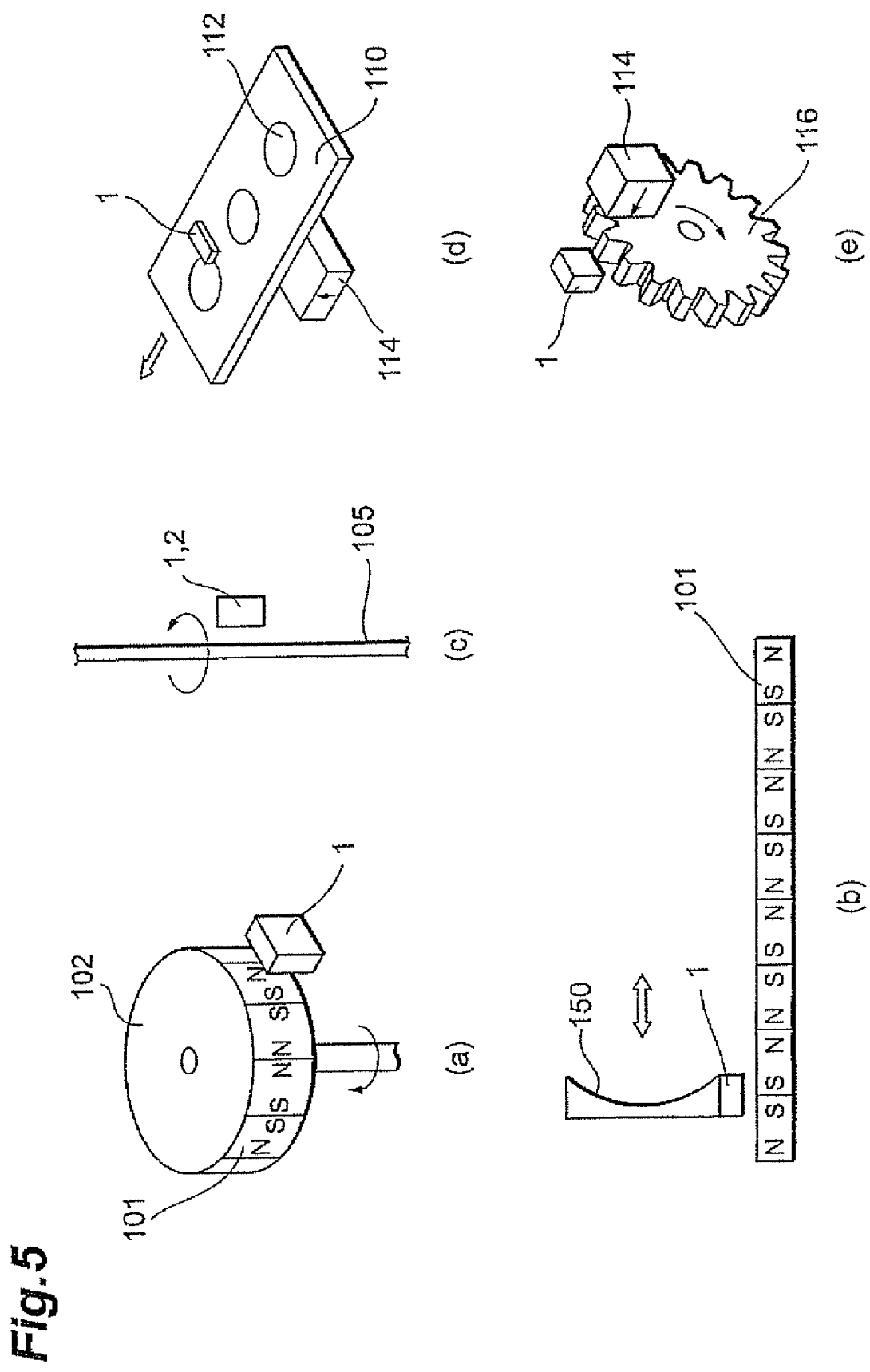
FIG. 5 is a schematic explanatory view for explaining states in which the magnetic sensors in accordance with the embodiments are used.

As shown in FIG. 5(a), such a magnetic sensor may be attached to a rotary member 102, so as to detect changes in a magnetic field from a recording medium 101 magnetized at predetermined intervals (e.g., equal intervals); thereby being utilizable as a rotary encoder. When the recording medium 101 magnetized at predetermined intervals (e.g., equal intervals) and the magnetic sensor 1 move relative to each other as shown in FIG. 5(b), the magnetic sensor 1 may detect the magnetic field from the recording, medium 101, so as to be utilizable as a linear encoder. For example, the magnetic sensor 1 may be attached to a lens 150. As shown in FIG. 5(c), the magnetic sensor 1 may be arranged near an electric wire 105, so as to detect inductive magnetic fields occurring from the electric wire, thereby being utilizable as a current sensor. As shown in FIG. 5(d), when a sheet 110 such as bi is printed with a soft magnetic body 112, the soft magnetic body 112 may be magnetized with a permanent magnet or electromagnet 114, and the resulting magnetic field may be detected whereby the magnetic sensor 1 is utilizable as a counterfeit sensor or the like. As shown in FIG. 5(e), teeth of a gear 116 made of a soft magnetic body may be magnetized with a permanent magnet or electromagnet 114, and the magnetic sensor 1 may detect the resulting magnetic field, so as to be utilizable as a gear tooth sensor. A plurality of magnetic sensors 1 may be combined in orthogonal directions, so as to be utilizable as an azimuth sensor which detects the direction of geomagnetism.

EXAMPLES A1 TO A3

A magnetic sensor such as the one shown in FIGS. 1 and 2 was made. The GMR stripe had a planar size of 100 µm×7-5 µm. The free layer was made of CoFe (1 nm n)/NiFe (6 nm)/CoFe (1 nm). A pair of permanent magnet layers, each having a planar size of 100 µm×20 µm, were separated from the GM stripe by 30 nm and made of CoNiCr. The thickness of the permanent magnet layer was 25 µm, 50 µm, and 100 µm in Examples A1, A1, and A3, respectively. As a consequence, different magnitudes of magnetic fields depending on the thickness of the permanent magnet layer were applied to the free layer in the direction of arrow C. Each of the magnetic fields was sufficiently stronger than the coercivity of the free layer.

Figure 6:
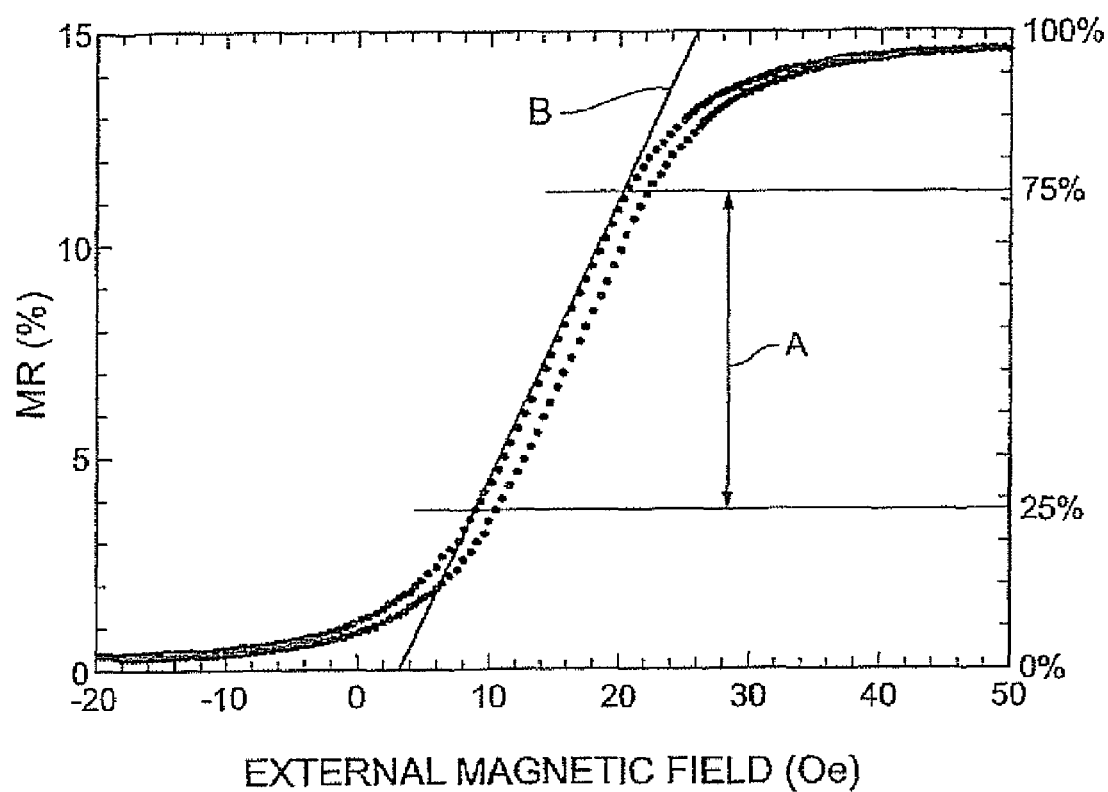
FIG. 6 is a graph showing a state of fitting a line to MR vs. external magnetic field curves.

Thereafter, while periodically applying an external magnetic field (−Hext to +Hext) in the X direction, the change in resistance between the pads was measured, whereby MR vs. external magnetic field curves were obtained (see FIG. 6). In the MR vs. external magnetic field curves, the maximum value of the external magnetic field Hext was set to about ±2400 Oe. In the middle part A (see FIG. 6) ranging from 25% to 75% within the width of change in MR in each curve, a line B was fit to the upper portion of the MR vs. external magnetic field curve, so as to determine a correlation coefficient $R^2$ for each permanent magnet layer thickness.

Figure 7:
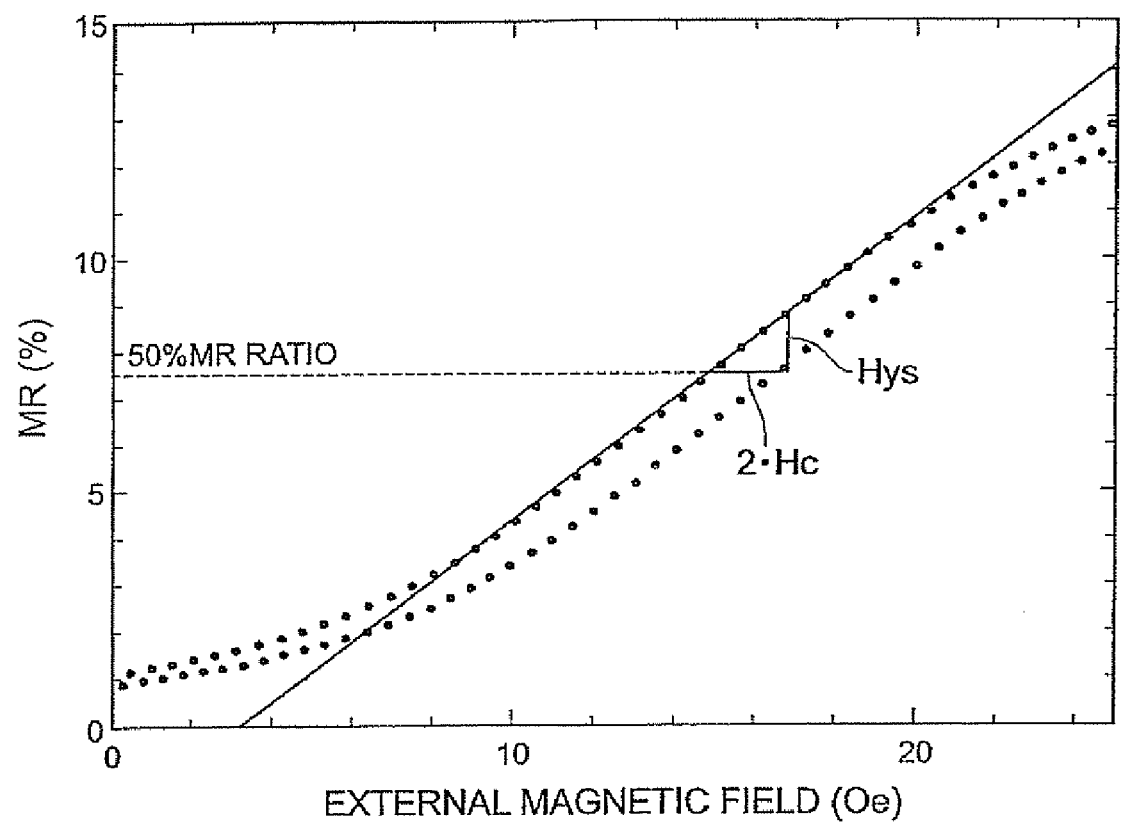
FIG. 7 is a graph showing Hys in MR vs. external magnetic field curves.
Figure 8:
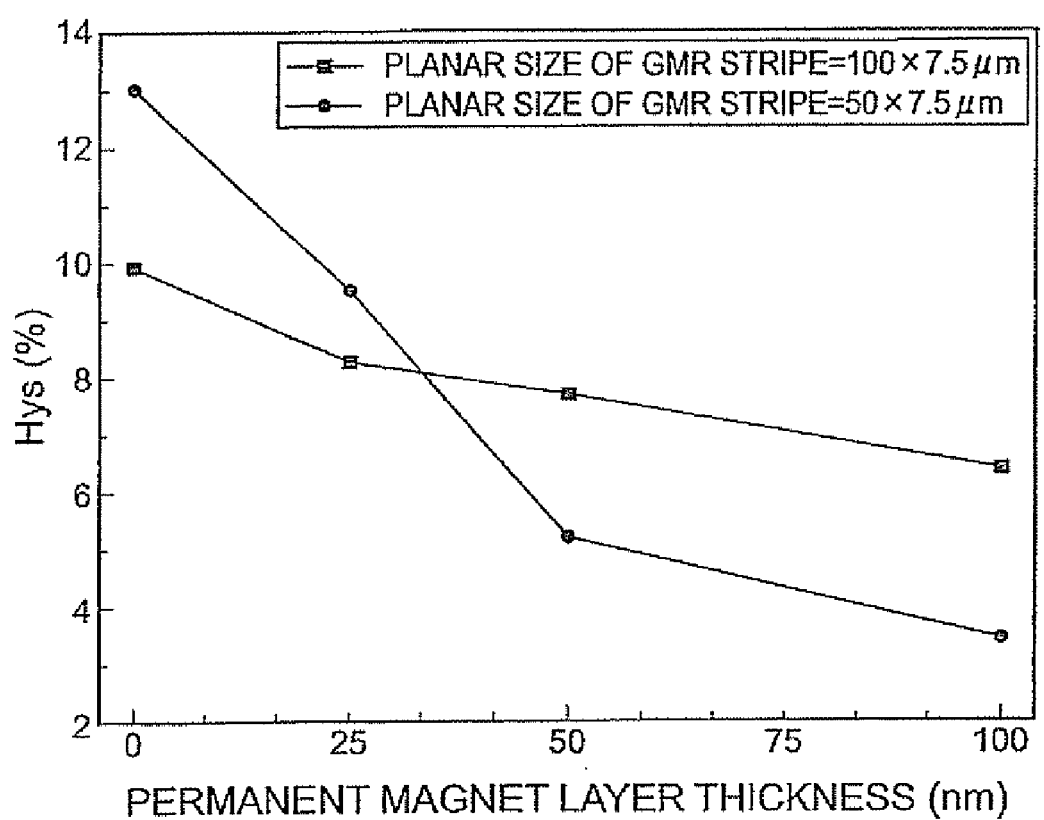
FIG. 8 is a graph showing relationships between the thickness of the permanent magnet layer and Hys in Examples A1 to A6 and Comparative Examples A1 and A2.
Figure 9:
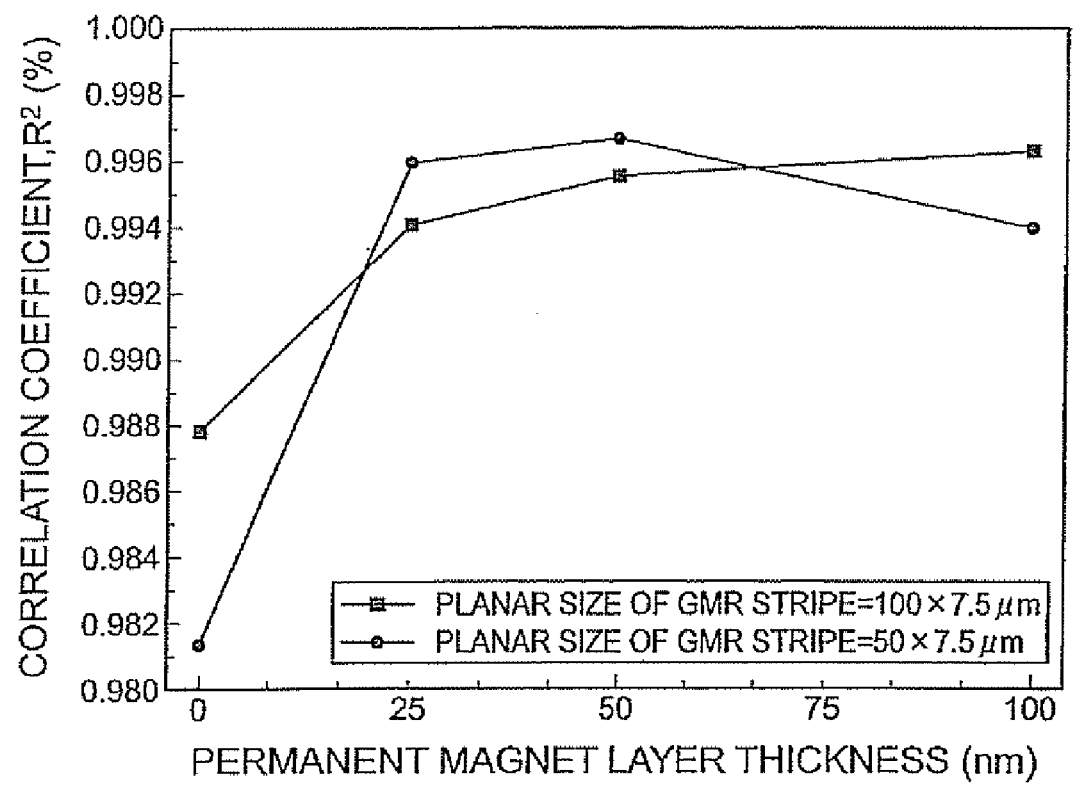
FIG. 9 is a graph showing relationships between the thickness of the permanent magnet layer and correlation coefficient $R^2$ in Examples A1 to A6 and Comparative Examples A1 and A2.
Figure 10:
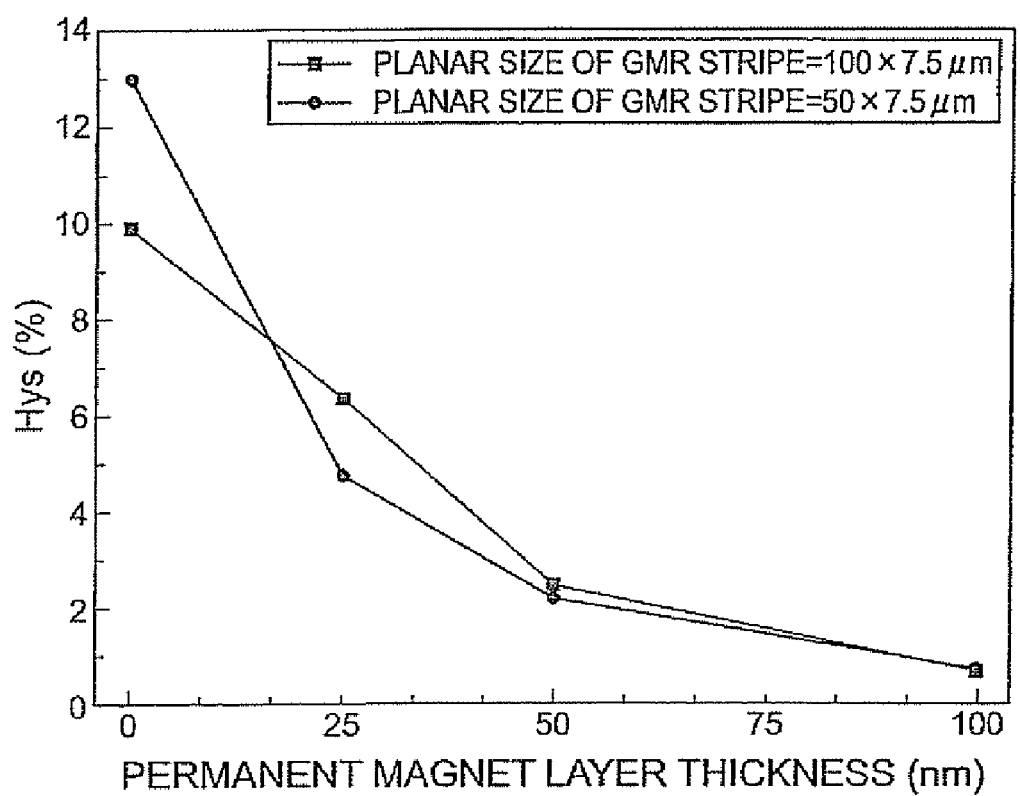
FIG. 10 is a graph showing relationships between the thickness of the permanent magnet layer and Hys in Examples B1 to B6 and Comparative Examples B1 and B2.
Figure 11:
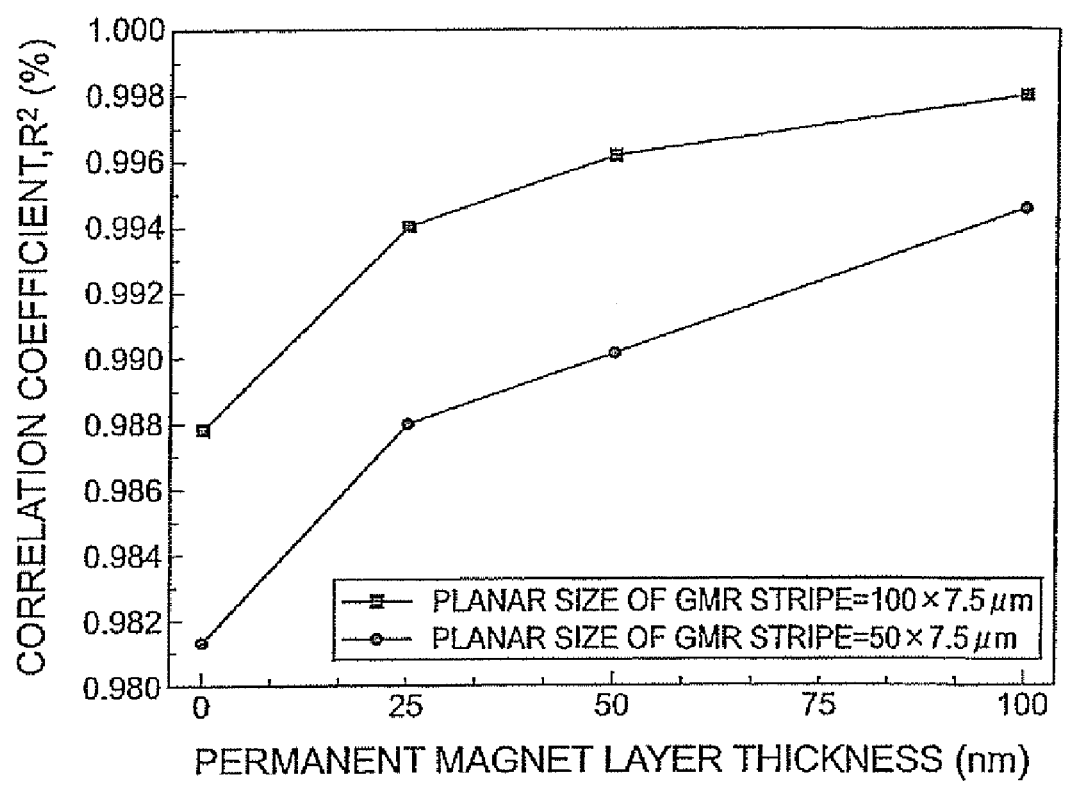
FIG. 11 is a graph showing relationships between the thickness of the permanent magnet layer and correlation coefficient $R^2$ in Examples B1 to B6 and Comparative Examples B1 and B2.

For each permanent magnet layer thickness, Hys was determined from the MR vs. external magnetic field curve. Here, as shown in FIG. 7, Hys (%) WC) gradient of the fitting line/50% of the MR ratio)×100, thus representing the degree of hysteresis. Hc is ½ of the difference in external magnetic field between the upper and lower curves (difference between values of the abscissa) at the position (ordinate) where the MR ratio is 50%. The MR ratio refers to MR (%) at the maximum value Hext of the external magnetic field.

EXAMPLES A4 TO A6

Examples A4 to A6 were the same as Examples A1 to A3, respectively, except that the planar size of each GMR stripe was 50 µm×7.5 µm.

COMPARATIVE EXAMPLES A1 AND A2

Comparative Examples A1 and A1 were the same as Examples A1 and A4, respectively, except that no permanent magnet layer was provided.

EXAMPLES B1 TO B6

Figure 3:
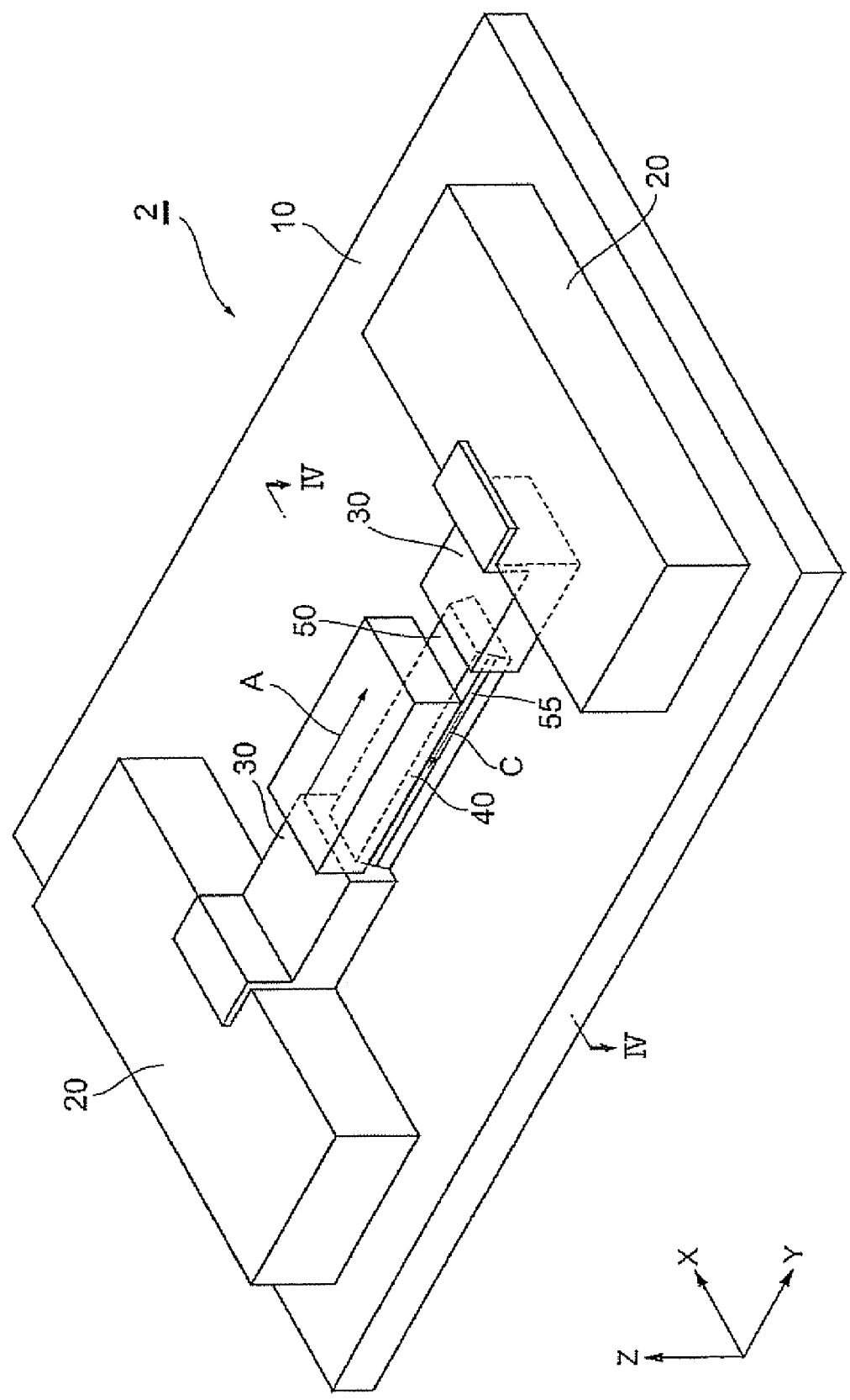
FIG. 3 is a schematic perspective view of the magnetic sensor in accordance with the second embodiment.
Figure 4:
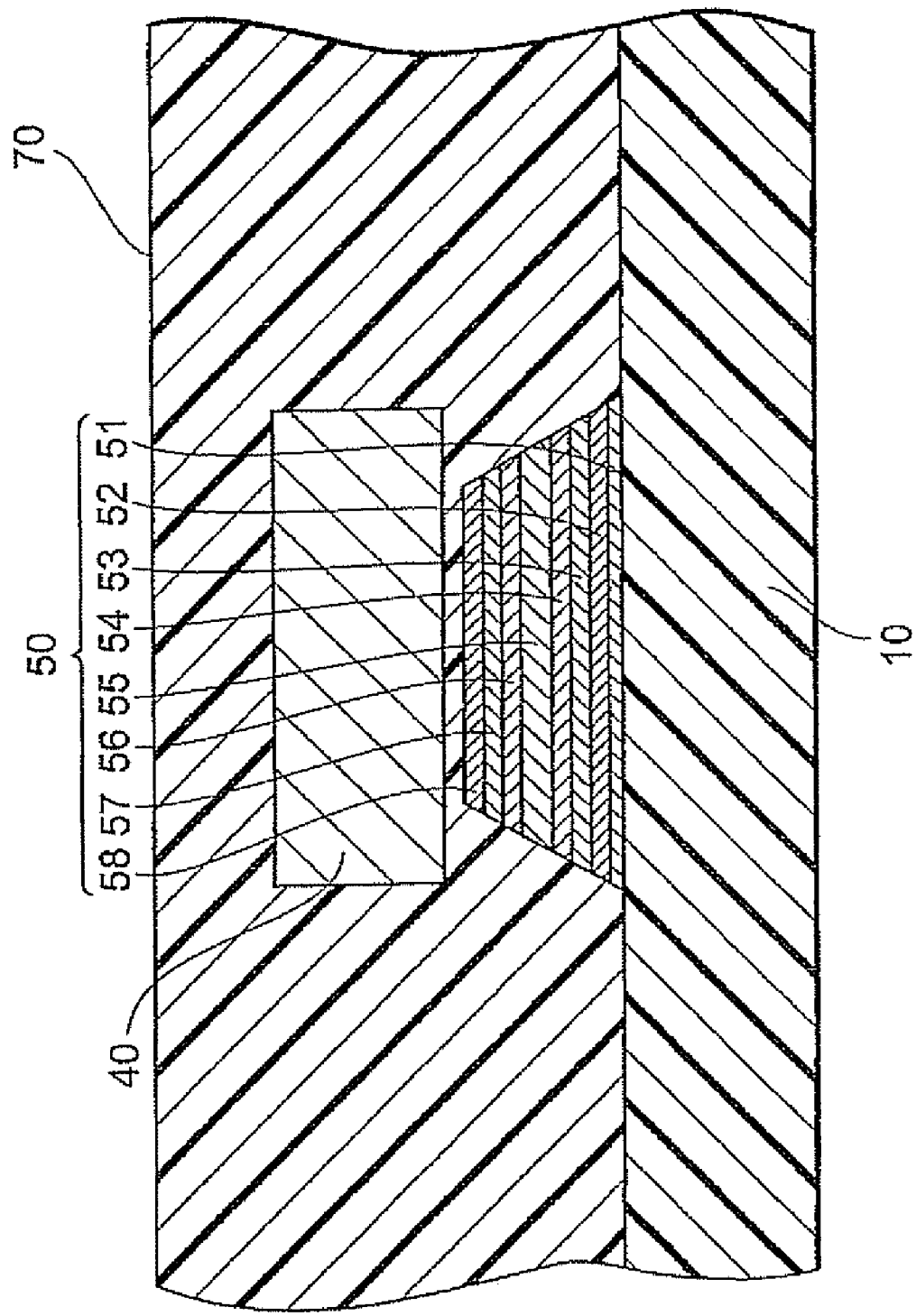
FIG. 4 is a sectional view taken along the line IV-V of FIG. 3.

Examples B1 to B6 were the same as Examples A1 to 6, respectively, except that one permanent magnet layer was arranged over the free layer as shown in FIGS. 3 and 4, the planar size of the permanent magnet layer was 90 µm×7.5 µm, and the distance from the permanent magnet layer to the GMR stripe was 30 nm.

COMPARATIVE EXAMPLES A3 AND A4

Comparative Examples A5 and A4 were the same as Examples B1 and B4, respectively, except at no permanent magnet layer was provided.

FIGS. 8 to 11 show the results. Providing the permanent magnet layer improved the correlation coefficient $R^2$ and lowered Hys.

What is claimed is:
1. A magnetic sensor comprising:
   a spin-valve GMR device including a free layer having an elongated form as seen in a laminating direction;
   a permanent magnet layer having an elongated form as seen in the laminating direction; and
   a first electrode pad and a second electrode pad for supplying a current to the spin-valve GMR device,
   wherein the permanent magnet layer and the free layer have respective longitudinal directions arranged parallel to each other and are separated from each other in a direction intersecting the longitudinal direction of the free layer, and
   the first electrode pad is electrically connected to a first end of the spin-valve GMR device in a longitudinal direction of the spin-valve GMR device and the second electrode pad is electrically connected to a second end of the spin-valve GMR in the longitudinal direction of the spin-valve GMR device.
2. A magnetic sensor according to claim 1, wherein the permanent magnet layer is provided in a pair, the pair of permanent magnet layers being arranged such as to hold the free layer therebetween in a direction intersecting the longitudinal direction of the free layer and intersecting the laminating direction of the free layer.

3. A magnetic sensor according to claim 1, wherein the permanent magnet layer is arranged over the free layer.

4. A magnetic sensor according to claim 1, wherein a bias magnetic field exerted on the free layer by the permanent magnet layer has a direction substantially parallel to the longitudinal direction of the free layer.

5. A magnetic sensor according to claim 4, wherein the longitudinal direction of the free layer is a direction of an axis of easy magnetization.

6. A magnetic sensor according to claim 1, wherein an aspect ratio of the spin-valve GMR device as seen in the laminating direction is 10 or greater.

7. A magnetic sensor according to claim 1, wherein directions of magnetization of antiferromagnetic layers are perpendicular to the longitudinal direction of the spin-valve GMR device.

8. A magnetic sensor according to claim 1, wherein a length of the permanent magnet layer in the longitudinal direction is equal to or greater than a length of the spin-valve GMR device in the longitudinal direction.

* * * * *